United States Patent
Cozzarelli

(12) 
(10) Patent No.: US 6,359,504 B1
(45) Date of Patent: Mar. 19, 2002

(54) POWER AMPLIFIER USING UPSTREAM SIGNAL INFORMATION

(75) Inventor: Joseph Cozzarelli, Lake Hiawatha, NJ (US)

(73) Assignee: Lucent Technologies Inc., Murray Hill, NC (US)

( * ) Notice: Subject to any disclaimer, the term of this patent is extended or adjusted under 35 U.S.C. 154(b) by 0 days.

(21) Appl. No.: 09/494,082

(22) Filed: Jan. 28, 2000

(51) Int. Cl.[7] ................................................ H03F 1/14
(52) U.S. Cl. ...................... 330/51; 330/124 R; 330/136
(58) Field of Search ............................. 330/51, 124 R, 330/129, 136

(56) References Cited

U.S. PATENT DOCUMENTS

| | | | | |
|---|---|---|---|---|
| 4,555,669 A | * | 11/1985 | Namiki | 330/149 |
| 5,304,943 A | * | 4/1994 | Koontz | 330/51 |
| 5,757,229 A | * | 5/1998 | Mitzlaff | 330/124 R |
| 5,886,572 A | * | 3/1999 | Myers et al. | 330/10 |
| 5,923,215 A | * | 7/1999 | Hans | 330/149 |
| 5,936,464 A | * | 8/1999 | Grondahl | 330/10 |
| 5,955,921 A | * | 9/1999 | Ide et al. | 330/254 |
| 6,100,756 A | * | 8/2000 | Wang et al. | 330/10 |
| 6,188,277 B1 | * | 2/2001 | Borodulin et al. | 330/51 |

OTHER PUBLICATIONS

"Improving the Power–Added Efficiency of FET Amplifiers Operatingt With Varying–Envelope Signals", Saleh, A. A. M., *IEEE Trans. On Microwave Theroy and Techniques*, vol. 31, No. 1, pp. 51–56 (Jan. 1983).

* cited by examiner

*Primary Examiner*—Benny Lee
*Assistant Examiner*—Henry Choe

(57) ABSTRACT

A power amplifier system uses upstream signal information of a signal to be amplified by an amplifier to control the operation of the amplifier, thereby enabling the amplifier to operate more efficiently overall. The power amplifier system can reconfigure the amplifier based on upstream signal information, such as the measured peak power, the measured average power, the number of users, the type of carriers (CDMA, TDMA, FDMA), the number of carriers and/or the average power per carrier. For example, based on upstream signal information for the signal to be amplified, processing circuitry can reconfigure the power amplifier architecture to adjust the peak power handling capability of the amplifier. By reducing the peak power handling capability of the amplifier, the long-term efficiency of the amplifier can be improved. The power amplifier system can adjust at least one operating characteristic of the amplifier while maintaining the configuration of the amplifier, for example by adjusting the bias voltage(s) to the amplifier based on upstream signal configuration information.

18 Claims, 2 Drawing Sheets

POWER AMPLIFIER USING UPSTREAM SIGNAL INFORMATION

BACKGROUND OF THE INVENTION

1. Field of the Invention

This invention relates to amplifiers and, more particularly, to a power amplifier which uses upstream signal information.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, a power amplifier, however, has a transfer function with nonlinear and "linear" regions. Whether the power amplifier is operating in a linear or nonlinear region depends on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to compress, to saturate (no appreciable increase in output amplitude with an increase in input amplitude) or to shut-off (no appreciable decrease in output amplitude with a decrease in input amplitude), the amplifer is being overdriven, and the output signal is clipped or distorted in a nonlinear fashion. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios (PAR). For example, in a time division multiple access (TDMA) system, when multiple carriers signals are combined for amplification with a power amplifier, the resulting PAR is about 9 dB for a large number of carriers. In a code division multiple access (CDMA) system, a single loaded 1.25 Mhz wide carrier can have a PAR of 11.3 dB. These signals have to be amplified fairly linearly to avoid generating ACP. To satisfy the linearity requirement, power amplifiers are usually operated in Class A and Class AB configurations. To be able to handle large peaks, the amplifiers are biased at high bias currents. The efficiency of the amplifiers is low because of the high bias and the high peak to average power ratios.

Accordingly, efficiency of the amplifier is inversely related to the ability to handle high peaks in a linear fashion. To achieve a high degree of linearity, the amplifiers are biased to operate in class A or "slight" class AB (meaning class AB operation that is closer to class A than to class B). Maximum AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency. For amplifiers employing field effect transistors, the class of operation is set in accordance with the gate voltage applied, which controls the quiescent (idle) drain current. For class A operation, the gate voltage is set so that the idle drain current is approximately in the middle of the range between pinch-off and saturation. Class B amplifiers are biased near pinch-off, resulting in a rectified drain current waveform. Class AB amplifiers are biased in between the bias points of classes A and B.

Typically, strict linearity requirements in modem wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive. Thus, a great deal of research has focused on the quest to improve amplifier efficiency in these and other systems.

Various methods are used to enable the use of more cost-effective and more power efficient amplifiers while maintaining an acceptable level of linearity. Feed-forward correction is routinely deployed in modern amplifiers to improve the linearity of the main amplifier with various input patterns. The essence of the feed-forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path. Pre-distortion techniques distort the input signal prior to amplification by taking into account the transfer function characteristics for the amplifier. As such, the desired amplified signal is achieved from the pre-distorted input signal. These techniques help to improve the efficiency of the amplifier while maintaining linearity, but to be able to handle the large peaks of a signal, the amplifiers still operate inefficiently. A technique described by Adel A. M. Saleh and Donald C. Cox, "Improving the Power-Added Efficiency of FET Amplifiers Operating with Varying Envelope Signals," IEEE Transactions On Microwave Theory and Techniques, Vol. 31, No. 1, January 1983 uses the input signal envelope to dynamically adjust the amplifier bias such that a high bias is only applied when a large peak is encountered.

Wireless base stations use a variety of radio frequency (RF) amplifers in both single carrier and multicarrier configurations operating in Class A and Class AB modes. FIG. 1 shows a typical feed-forward power amplifier architecture 10 which includes a main amplifier 12 to amplify the input signal on the main signal path 13 and a correction amplifier 14 used in reducing the distortion produced from the main amplifier 12. Feed-forward correction is routinely deployed in modern amplifiers to improve the linearity of the main amplifier 12 with various input patterns. The essence of the feed-forward correction is to isolate on a distortion cancellation path 16 the distortion generated by the main amplifier 12. To isolate the distortion on the distortion cancellation or feed forward path 16, a coupler 17 provides a version of the amplified input signal and distortion from the output of the main amplifier 12 onto a coupling path 18 to a coupler 19. A coupler 20 provides an inverse version of the input signal from the main signal path 13 to the coupler 19. The coupler 19 combines the amplified input signal and distortion from the coupling path with an inverse version of the input signal from the main signal path 13. As such, the input signals cancel and the distortion is left on the distortion cancellation path 16. The distortion is provided to the correction amplifier 14 which amplifies the distortion on the distortion cancellation path 16. A combiner 22 cancels the distortion on the main signal path 13 with the distortion on the distortion cancellation path 16 to reduce the distortion produced from the main amplifier 12. In general, as the peak power levels decrease of the signal to be amplified, the peak power levels decrease of the distortion signal to be amplified by the correction amplifier 14.

Other power amplifier architectures are possible which use different structures and do not use a correction amplifier 14 as described above to reduce the nonlinear distortion of the signal. For example, the correction amplifier 14 can be replaced with a second amplifier or amplifiers in an arrangement where the amplifiers amplify versions of the original signal, and the amplified versions of the original signal are combined to produce the amplified signal while producing reduced distortion. For example, U.S. Pat. No. 5,917,375 issued on Jun. 29, 1999 entitled "Low Distortion Amplifier Circuit with Improved Output Power" describes a power amplification architecture using multiple amplifiers. Other power amplification architectures use pre-distortion techniques and baseband processing techniques to improve the efficiency and/or linearity of the power amplification architecture.

To achieve higher output powers, an amplifier can be configured as parallel amplifier stages of like amplifiers to provide the same gain as the individual amplifiers while increasing the overall power handling capability with each amplifier. The main amplifier 12 includes an arrangement of splitters 24a–c which split the input signal among parallel amplifiers 26a–d. An arrangement of combiners 28a–c combines the outputs of the parallel amplifiers 26a–d to produce an amplified signal on the main signal path 13. The main amplifier 12 has the same gain as an individual amplifier 26a–n but the power handling capability of the main amplifier 12 is increased by the power handling capability of each individual amplifier 26a–d. For example, if each individual amplifier 26a–d has a 100 watts of power handling capability, the main amplifier 12 has (100 * 4) watts of power handling capability. Thus, the main amplifier 12 can handle peak powers of 400 watts. Peak power handling capability is important because peak power increases as the number of users increase. Because the distortion signal on the distortion cancellation path 16 is typically smaller, the correction amplifier 14 is designed in a parallel architecture to handle smaller peak powers. For example, the correction amplifier 14 includes a splitter arrangement 30 splitting the distortion signal among parallel amplifiers 32a–b, and a combiner arrangement 34 combines the amplified distortion signal. If each individual amplifier 32a–m has a power handling capability of 20 watts, the correction amplifier 14 has a power handling capability of 40 watts.

As such, in the described feed forward architecture, the main amplifier 12 is the largest single contributor to the overall power consumption in CDMA, TDMA and frequency division multiple access (FDMA) base stations. Due to the potential for high peak powers, the main amplifier 12 is biased with a high current to be able to handle those peak powers when they do occur. The efficiency, however, of the main amplifiers 12 is typically less than 30%. This low efficiency leads to higher power consumption, shorter battery backup time, lower overall reliability and higher operating temperatures. Accordingly, there is a need for a more efficient power amplifier architecture.

SUMMARY OF THE INVENTION

The present invention involves a power amplifier system using upstream signal information of a signal to be amplified by an amplifier to control the operation of the amplifier, thereby enabling the amplifier to operate more efficiently overall. The power amplifier system can reconfigure the amplifier based on upstream signal information, such as the measured peak power, the measured average power, the number of users, the type of carriers (CDMA, TDMA, FDMA), the number of carriers and/or the average power per carrier. For example, based on upstream signal information for the signal to be amplified, processing circuitry can reconfigure the power amplifier architecture to adjust the peak power handling capability of the amplifier. By reducing the peak power handling capability of the amplifier, the long-term efficiency of the amplifier can be improved. The power amplifier system can adjust at least one operating characteristic of the amplifier while maintaining the configuration of the amplifier, for example by adjusting the bias voltage(s) to the amplifier based on upstream signal configuration information.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
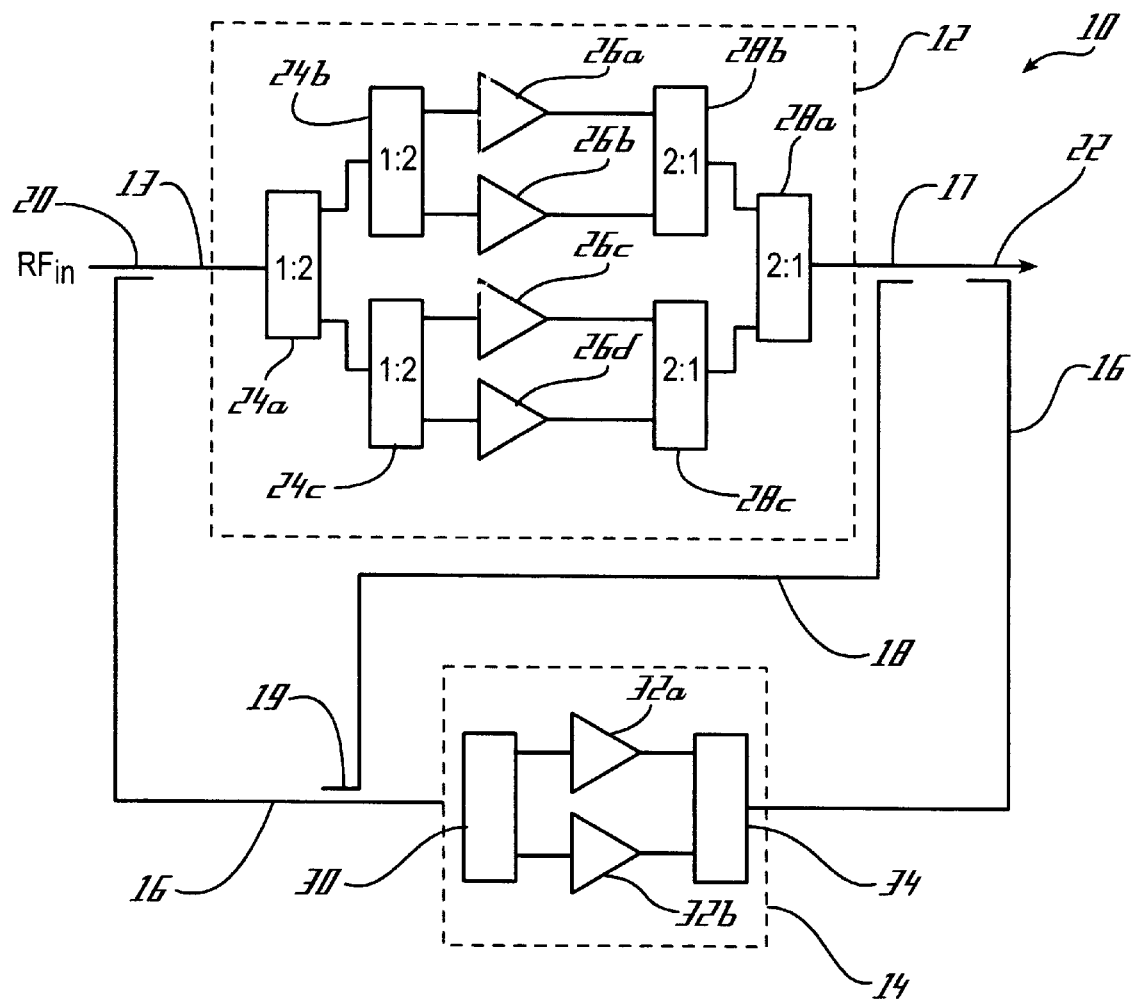
FIG. 1 shows a power amplifier architecture which can use upstream signal information according to the principles of the present invention.
Figure 2:
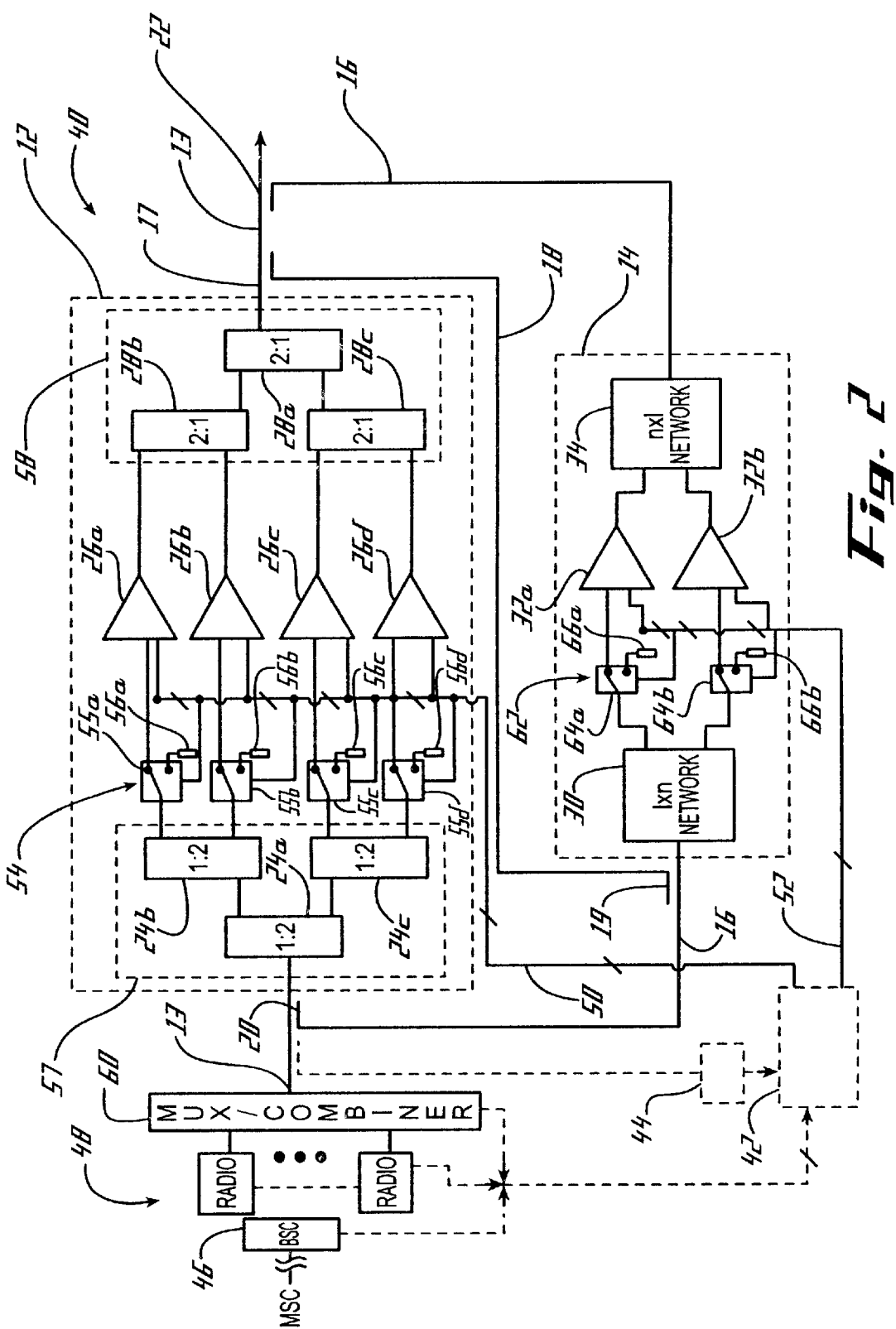
FIG. 2 shows the power amplifier architecture using upstream information according to the principles of the present invention.

An illustrative embodiment of a power amplifier system using upstream information according to the principles of the present invention is described. FIG. 2 shows a general block diagram of a feed forward power amplifier architecture 40 using upstream signal information of the signal to be amplified by a main amplifier 12 to control the power handling capability of the main amplifier 12 and/or of the correction amplifier 14. In this embodiment, the main amplifier 12 has parallel amplifier stages 26a–d, and the correction amplifier 14 has parallel amplifier stages 32a–b. Processing circuitry 42 receives or obtains upstream signal information on the signal to be amplified by the main amplifier 12, for example upstream signal power detection information from a power detector 44 representing the measured peak and/or average power of the signal on the main signal path 13 to be amplified by the amplifier 12. Additionally or alternatively, the processing circuitry 42 can receive upstream signal configuration information which describes the signal to be amplified without directly performing measurements on the main signal path 13, for example information on the composition, component signals and structure for the signal to be amplified, such as the number of carriers comprising the signal to be amplified, the type of carriers (for example, CDMA, TDMA or FDMA) and/or the number of users for which the signal is produced. The upstream signal configuration information can be provided by a base station controller (BSC) 46, the switching circuitry (MUX) and/or radio circuitry 48 to the processing circuitry 42. The processing circuitry 42 or portions thereof can be located in the BSC 46, the switching circuitry (MUX) and/or the radio circuitry 48.

Depending on the embodiment, the upstream signal information received or obtained by the processing circuitry 42 can include the upstream signal configuration information, the upstream signal power information and/or other upstream signal information. In response to the upstream signal information, the processing circuitry 42 provides control signal(s) 50 to control the peak power capability of the main amplifier 12 and/or control signal(s) 52 to control the peak power capability of the correction amplifier 14. Based on the upstream signal information, the processing circuitry 42 can provide control signal(s) 50 to control the peak power capability of the main amplifier 12 and/or control signal(s) 52 to control the peak power capability of the correction amplifier 14 (in this feed forward embodiment or other amplifier(s), if any, of other architectures), for example by turning "on" or "off" amplifier stages 26a–d in the main amplifier 12 and/or amplifier stages 32a–b in the correction amplifier 14. Depending on the embodiment, the processing circuitry 42 can adjust at least one operating characteristic of the main amplifier 12 and/or the correction amplifier 14 based on upstream signal configuration information or in response to the shutting down of the amplifier stage(s), for example by adjusting the bias voltage(s) and/or source voltage(s) to the amplifier 12. The operating characteristics of the amplifier and/or amplifier stage can include the power handling capability, including the peak power handling capability, and/or the class of operation of the amplifier.

In this embodiment, if each individual amplifier 26a–d has a 100 watts of power handling capability, the main amplifier 12 has 100 watts × the number of parallel power amplifier stages of power handling capability. As such, the main amplifier 12 can handle peak powers of 400 watts. If the detected power level of the signal to be amplified is below a particular level, for example 300 watts, the processing circuitry 42 can provide control signal(s) to amplifier stages 26a–d to shut-off an amplifier or amplifiers, for example amplifier 26d. An amplifier stage 26a–d can be shut-down by cutting off the source voltage and/or the bias voltage. By shutting off an amplifier or amplifiers, the power amplifier efficiency (output power over DC power consumed) is improved because the output power effectively remains the same while the DC power consumed is reduced.

In response to or based on the upstream signal information or in response to the turning off of an amplifier(s) or amplifier stage(s), the processing circuitry 42 can provide control signal(s) to a switching network 54 to divert the signal power for the shut-down amplifier(s) to a termination or load. For example, the processing circuitry 42 can provide control signal(s) to low power radio frequency (RF) switches 55a–d which make up the switching network 54 in this embodiment. In response to the control signal(s), the low power RF switches 55a–d route the power of the signal which would be amplified by the shut-down amplifier stage (s) to respective terminations 56a–d, and the remaining power is routed to the active amplifier stage(s) for amplification. Based on the upstream signal information or in response to the amplifier stage(s) which are shut-down, the processing circuitry 42 can adjust at least one of the operating characteristics of the active amplifier stage(s), for example by adjusting the bias voltage(s) to the active amplifier stage(s), such as to increase the bias voltage(s).

In this embodiment, the splitting network 57 is an arrangement of 1:2 splitters 24a–c, and the splitter 24a splits the signal into two replicas of the original signal having one-half the power. Each splitter 24b–c receives a ½ power replica of the original signal and splits the ½ power replica of the original signal into two ¼ power replicas of the original signal, and each amplifier stage 26a–d amplifies one of the four (4) ¼ power replicas of the original signal. If the amplifier stage 26d is shut-down, the processing circuitry 42 provides a control signal to the switch 55d to route the power from the switching network 57 for the amplifier stage 26d to the termination 56d, such as a 50 ohm termination. The remaining power, for example from the switches 55a–c, is provided to the active amplifier stages 26a–c for amplification. After amplification, a combining network 58 combines the amplified copies of the signal from the active amplifier stages and combines them to provide the amplified signal at the desired level as would be understood by one of skill in the art. In this embodiment, combining network 58 is an arrangement of 2:1 combiners 28a–c.

If the power level of the signal to be amplified is even lower, for example below a second threshold level (such as 200 watts or 50% of the total peak power handling capability of the amplifier 12), the processing circuitry 42 can shut-off additional amplifiers, for example the amplifiers 26c–d. In this embodiment with four similar or the same parallel amplifier stages 26a–d with the same operating characteristics, the peak power handling capability of the amplifier 12 can be adjusted by 25% increments. If the amplifier 12 has six parallel amplifier stages operating with the same operating characteristics, the peak power handling capability of the amplifier 12 could be adjusted in 16.7% increments by turning off or on amplifier stages. As such, the processing circuitry 42 can provide control signal(s)to the switching network 54, for example to switches 55c–d, such that the power from the splitting network 57 for the shut-down amplifier stages 26c–d is diverted to a termination, for example respective terminations 56c–d. The remaining power, for example from the switches 55a–b, is provided to the active amplifier stages 26a–b for amplification. After amplification, the combining network 58 combines the amplified copies of the signal from the amplifiers 26a–b as would be understood by one of skil in the art.

In the embodiment of FIG. 2, the power amplification architecture 40 is a feed forward arrangement where a coupler 17 provides a version of the amplified input signal and distortion from the output of the main amplifier 12 onto the coupling path 18 to the coupler 19. The coupler 19 combines the amplified input signal and distortion with an inverse version of the input signal and distortion from the main signal path 13. As such, the input signals cancel, and the distortion is left on the feed forward path 16. The distortion is provided to the correction amplifier 14 which amplifies the distortion on the distortion cancellation path 16. A combiner 22 cancels the distortion on the main signal path 13 with the distortion on the feed forward path 16 to reduce the distortion produced from the main amplifier 12. As the peak power levels decrease of the signal to be amplified, the peak power levels decrease of the distortion signal to be amplified by the correction amplifier 14. Accordingly, the processing circuitry 42 can provide control signals 52 to amplifier stages 32a–b of the correction amplifier 14 to de-activate or shut-down an amplifier stage 32a–b.

The processing circuitry 42 can provide control signal(s) 52 to switching network 62, for example of low power RF switches 64a–b, to divert the power from the splitting network 30, for example a 1:2 splitter, for the shut-down amplifier stage(s) 32a and/or b to a termination, for example to associated terminations 66a and/or b. For example, the processing circuitry 42 can provide a control signal to shut-down the amplifier stage 32b, and a control signal (or the same control signal) to switch 64b to divert the power from the splitter 30 for the deactivated amplifier stage 32b to the termination 66b. As such, the distortion signal can be amplified by the amplifier stage 32a and provided to the coupler 22. Depending on the embodiment, the processing circuitry 42 could shut-down both amplifier stages 32a–b and thereby the correction amplifier 14 depending on the upstream signal information.

The power amplification system according to principles of the present invention can operate with other power amplifier architectures which use different structures and do not use a correction amplifier 14 as described above to reduce the nonlinear distortion of the signal. For example, the correction amplifier 14 can be replaced with a second amplifier or amplifiers in an arrangement where the amplifiers amplify versions of the original signal, and the amplified versions of the original signal are combined to produce the amplified signal while producing reduced distortion. Other power amplification architectures are possible.

In one embodiment, the processing circuitry 42 receives upstream signal power detection information comprising peak power information of a signal, such as a multicarrier signal, on the path 13 after the signal multiplexer/combiner 60 and before the amplifier 12. In response to the peak power information, the processing circuitry 42 can determine the peak power demand of the signal to be amplified and/or can provide control signal(s) 50 to control the peak power capability of the main amplifier 12 and/or control signal(s) 52 to control the peak power capability of the correction amplifier 14 (in this feed forward embodiment or other amplifier(s), if any, of other architectures). In response to peak power demand and/or the upstream signal power detection information, the processing circuitry can reconfigure the amplifier 12 and/or the correction amplifier 14, for example by turning "on" or "off" amplifier stages 26a–d in the main amplifier 12 and/or amplifier stages 32a–b in the correction amplifier 14 as well as providing control signals to switching and/or combining networks 54, 58, 62 and/or 32. Additionally, based on the upstream signal power detection information or the reconfiguration of the amplifier(s), the processing circuitry 42 can further change the power handling capability and/or the operating characteristics of the active amplifier stage(s), for example by changing the bias voltage(s) to the active amplifier stage(s).

In an alternative embodiment, the processing circuitry 42 receives upstream signal configuration information, for example the number of carriers comprising the signal to be amplified and the type of carriers (for example, CDMA, TDMA or FDMA). In response to the upstream signal configuration information, the processing circuitry 42 can reconfigure the amplifier 12 and/or the correction amplifier 14 (in this feed forward embodiment or other amplifier(s), if any, of other architectures). For example, using the upstream signal configuration information, processing circuitry 42 can determine a peak power demand of the signal to be amplified. For example, peak power demand can be determined as $P_{demand} = P_{avg} + Gain + P_{factor}$, where $P_{avg}$ is the average power of the signal at the input to the amplifier 12 which can be provided or determined by knowing the number of carriers or users in the signal and the average power per carrier as upstream signal configuration information. The Gain is the gain of the amplifier 12, and the peak to average power ratio factor $P_{factor}$ can be determined using upstream signal configuration information, for example the type of carriers and/or the number of carriers. For example, $P_{factor}$ can be 8 dB for an FDMA carrier, 9 dB for a TDMA carrier and 11.3 dB for a CDMA carrier type. These values may be determined based on the number of carriers or further changed for known type of carriers based on the number of carriers. Depending on the embodiment, the $P_{demand}$, $P_{avg}$, Gain and/or $P_{factor}$ can be provided as upstream signal configuration information or used to determine or provide upstream signal configuration information by determining peak power demand given upstream signal configuration information or providing the peak power demand by providing the upstream signal configuration information to a look-up table.

In response to the peak power demand and/or the upstream signal configuration information, the processing circuitry can provide control signal(s) 50 to control the peak power capability of the main amplifier 12 and/or control signal(s) 52 to control the peak power capability of the correction amplifier 14 (in this feed forward embodiment). The processing circuitry 42 can reconfigure the amplifer 12 and/or the correction amplifier 14 by turning "on" or "off" amplifier stages 26a–d in the main amplifier 12 and/or amplifier stages 32a–b in the correction amplifier 14 as well as providing control signal(s) to switching and/or combining networks 54, 58 62 and/or 34. Alternatively or additionally, based on the upstream signal configuration information or in response to the reconfiguration, the processing circuitry 42 can change the power handling capability and/or the operating characteristics, such as operating class of the main amplifier 12, the correction amplifier 14 (in this feed forward embodiment or other amplifier(s), if any, of other architectures) and/or of the amplifier stage(s) 26a–d or 32a–b, for example by changing the bias voltage(s) to the amplifier stage(s).

Furthermore, the processing circuitry 42 can receive upstream signal information which includes both upstream signal configuration information and upstream signal power detection information, for example the average power and/or the peak power of the signal on the path 13 after the multiplexer or combiner 60 and before the main amplifier 12 and the type of carriers and/or number of carriers comprising the signal to be amplified. In response to the upstream signal configuration information and the upstream signal power detection information, the processing circuitry 42 can reconfigure the amplifier 12 and/or the correction amplifier 14 (in this feed forward embodiment or other amplifier(s), if any, of other architectures). For example, using the upstream signal configuration information and the upstream signal power detection information, the processing circuitry 42 can determine a peak power demand for the signal to be amplified. For example, as mentioned above, if $P_{demand} = P_{avg} + Gain + P_{factor}$, $P_{avg}$ can be measured as upstream signal power detection information by power detector 44 at the input to the amplifier 12 and $P_{factor}$ can be determined by the type of carriers and/or the number of carriers as upstream signal configuration information.

In response to the peak power demand and/or the upstream signal information, the processing circuitry can provide control signal(s) 50 to control the peak power capability of the main amplifier 12 and/or control signal(s) 52 to control the peak power capability of the correction amplifier 14 (in this feed forward embodiment). The processing circuitry 42 can reconfigure the amplifier 12 and/or the correction amplifier 14 by turning "on" or "off" amplifier stages 26a–d in the main amplifier 12 and/or amplifier stages 32a–b in the correction amplifier 14 as well as providing control signal(s) to switching and/or combining networks 54, 58, 30 and/or 34 as described above. Alternatively or additionally, based on the upstream signal configuration information or in response to the reconfiguration, the processing circuitry 42 can change the power handling capability and/or the operating characteristics, such as the operating class of the main amplifier 12, the correction amplifier 14 (in this feed forward embodiment or other amplifier(s), if any, of other architectures) and/or of the amplifier stage(s)

26a–d or 32a–b, for example by changing the bias voltage(s) to the amplifier stage(s).

Depending on the embodiment, the processing circuitry 42 can use the upstream signal configuration information to determine a peak power demand, and reconfigure and/or change the operating characteristics or peak power handling capability of the main amplifier 12 and/or the correction amplifier 14 to efficiently handle such peak powers determined for the signals characterized by the upstream signal configuration information. Furthermore, the processing circuitry can further receive upstream signal power detection information, such as the actual peak power of the signal to be amplified, to further reconfigure the main amplifier 12 and/or the correction amplifier 14 (in this feed forward embodiment or other amplifier(s), if any, of other architectures) and/or control the operating characteristics of the amplifier stage(s). Additionally, the processing circuitry 42 can provide control signal(s) to reconfigure the amplifier (s) by shutting-down amplifier stage(s) based on the upstream signal information and changing the operating characteristics of the active amplifier stage(s) based on the upstream signal information or in response to the reconfiguration, for example by adjusting the bias voltage(s) of the operating amplifier stage(s).

In addition to the embodiment described above, alternative configurations of the power amplification architecture according to the principles of the present invention are possible which omit and/or add components and/or use variations or portions of the described system. For example, the power amplification system has been described as determining a peak power demand from the upstream signal information to control the amplifier(s), but embodiments of the amplification system can control the reconfiguration and/or operation of the amplifier(s) and/or the amplifier stages(s) based on upstream signal information without affirmatively calculating peak power demand from the upstream signal information, for example if the upstream signal information is input to a look-up table which produces particular control signal(s) to control the reconfiguration and/or operating characteristics of the amplifier(s) and/or amplifier stage(s). Moreover, the upstream signal information can include or be the peak power demand. Additionally, the embodiments of the power amplification system have been described as being used with a particular feedforward RF amplifier arrangement, but the architecture can be used to improve signal amplification in other amplifier or electrical circuit arrangements. Depending on the embodiment, the main amplifier 12 can be the only amplifier, and there is no correction amplifier. Additional amplifier(s) can be used to amplify replicas of the original signal which are recombined to produce the amplified signal. Other architectures are possible which use combinations of the above described architectures and/or techniques for amplifying a signal in a more efficient and/or linear fashion.

Furthermore, the power architecture system has been described as detecting certain upstream signal information, but other parameters or characteristics of the signal to be amplified can be detected along with the upstream signal information or as the upstream signal information. The system has also been described as shutting off or on particular amplifier stage(s), but the amplifier stage(s) which shut off or on can be rotated or changed in any desired manner. The system has been described as using couplers, splitters and combiners, but other devices, such as 3 dB splitters and other coupling, signal splitting, or sampling devices, can be used as well as other combining arrangements or devices, such as summers. The power amplifier architecture has been further described as using different configurations using discrete components, but it should be understood that the architecture and portions thereof can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A power amplification circuit, said circuit comprising:
   a first amplifier having a plurality of amplifier stages; and
   a first plurality of switches wherein each of said switches is configured to direct signals inputted to said switch to one of a first plurality of impedances or to an input of one of said plurality of amplifier stages of said first amplifier.

2. The circuit of claim 1, further comprising:
   a second amplifier electrically coupled to said first amplifier and having a plurality of amplifier stages; and
   a second plurality of switches wherein each of said switches is configured to direct signals inputted to said switch to one of a second plurality of impedances or to an input of one of said plurality of amplifier stages of said second amplifier.

3. The circuit of claim 2, further comprising a sensing circuitry electrically coupled to said first amplifier and said second amplifier and configured to provide upstream signal information comprising at least one of the number of carriers comprising the signal to be amplified by said amplifier, the type of carriers comprising the signal to be amplified by said amplifier, the number of users for which the signal to be amplified by said amplifier is amplified, the average power of the signal to be amplified by said amplifier, and the peak power of the signal to be amplified by said amplifier.

4. The circuit of claim 3, further comprising a processing circuitry configured to be responsive to said upstream signal information to provide control signals to said first plurality of switches and said second plurality of switches.

5. The circuit of claim 4 wherein said processing circuitry is further configured to be responsive to said upstream signal information to provide control signals to said plurality of amplifier stages of said first amplifier and said second amplifier to adjust one or more operating characteristics of said amplifier stages.

6. A power amplification system, said system comprising:
   an amplifier having a plurality of amplifier stages wherein said amplifier is responsive to control signals to turn off one or more of said amplifier stages and to divert the signal to be amplified from said amplifier stages that are turned off to a termination or load, and said amplifier is responsive to control signals to turn on one or more of said amplifier stages and to divert the signal to be amplified from a termination or load to said amplifier stages that are turned on.

7. The system of claim 6 wherein said amplifier is additionally responsive to control signals to adjust one or more operating characteristics of said amplifier stages.

8. The system of claim 7 wherein said operating characteristics comprise at least one of the bias and source voltages of said amplifier stages.

9. A method of amplifying a signal, comprising:

providing an amplifier having a plurality of amplifier stages operating in a present circuit configuration;

obtaining upstream signal information of said signal to be amplified by said amplifier;

turning off one or more of said amplifier stages responsive to said upstream signal information indicating that said present circuit configuration of said amplifier provides more power handling capability than needed for the signal to be amplified;

diverting the signal to be amplified from said amplifier stages which have been turned off to a termination or load;

turning on one or more of said amplifier stages responsive to said upstream signal information indicating that said present circuit configuration of said amplifier provides less power handling capability than needed for the signal to be amplified; and diverting the signal to be amplified from a termination or load to said amplifier stages which have been turned on.

10. The method of claim 9 wherein said step of obtaining comprises obtaining at least one of the number of carriers comprising the signal to be amplified by said amplifier, the type of carriers comprising the signal to be amplified by said amplifier, and the number of users for which the signal to be amplified by said amplifier is amplified.

11. The method of claim 9 wherein said step of obtaining comprises measuring at least one of the average power and peak power of the signal to be amplified by said amplifier.

12. The method of claim 9, further comprising the step of adjusting one or more operating characteristics of said amplifier stages responsive to said upstream signal information.

13. The method of claim 12 wherein said operating characteristics comprise at least one of the bias and source voltages of said amplifier stages.

14. A power amplification system, said system comprising:

an amplifier having a plurality of amplifier stages operating in a present circuit configuration; and a processing circuitry configured to provide one or more control signals to cause said amplifier to turn off one or more of said amplifier stages and to divert the signal to be amplified from said amplifier stages which have been turned off to a termination or load responsive to said upstream signal information indicating that said present circuit configuration of said amplifier provides more power handling capability than needed for the signal to be amplified, said processing circuitry being further configured to provide one or more control signals to cause said amplifier to turn on one or more of said amplifier stages and to divert the signal to be amplified from a termination or load to said amplifier stages which have been turned on responsive to said upstream signal information indicating that said present circuit configuration of said amplifier provides less power handling capability than needed for the signal to be amplified.

15. The system of claim 14 wherein said upstream signal information comprises at least one of the number of carriers comprising the signal to be amplified by said amplifier, the type of carriers comprising the signal to be amplified by said amplifier, and the number of users for which the signal to be amplified by said amplifier is amplified.

16. The system of claim 14 wherein said upstream signal information comprises at least one of the average power and peak power of the signal to be amplified by said amplifier.

17. The system of claim 14 wherein said processing circuitry is further configured to provide control signals to said amplifier to adjust one or more operating characteristics of said amplifier stages responsive to said upstream signal information.

18. The system of claim 17 wherein said operating characteristics comprise at least one of the bias and source voltages of said amplifier stages.

* * * * *